United States Patent
Talag et al.

(10) Patent No.: US 11,696,082 B2
(45) Date of Patent: Jul. 4, 2023

(54) INSERT MOLDED OR OVER MOLDED INSULATING LAYERS ON ENCLOSURES FOR MICROPHONE ASSEMBLIES

(71) Applicant: Knowles Electronics, LLC, Itasca, IL (US)

(72) Inventors: Norman Dennis Talag, Woodridge, IL (US); Lili Borna, Bartlett, IL (US); Tony K. Lim, Naperville, IL (US)

(73) Assignee: Knowles Electronics, LLC, Itasca, IL (US)

(*) Notice: Subject to any disclaimer, the term of this patent is extended or adjusted under 35 U.S.C. 154(b) by 319 days.

(21) Appl. No.: 16/938,917

(22) Filed: Jul. 25, 2020

(65) Prior Publication Data

US 2021/0037330 A1 Feb. 4, 2021

Related U.S. Application Data

(60) Provisional application No. 62/880,849, filed on Jul. 31, 2019.

(51) Int. Cl.

| | |
|---|---|
| *H04R 1/08* | (2006.01) |
| *H04R 9/08* | (2006.01) |
| *H04R 11/14* | (2006.01) |
| *H04R 17/02* | (2006.01) |
| *H04R 21/02* | (2006.01) |
| *H04R 31/00* | (2006.01) |
| *H05K 9/00* | (2006.01) |

(52) U.S. Cl.
CPC ......... *H04R 31/003* (2013.01); *H04R 31/006* (2013.01); *H05K 9/0007* (2013.01); *H04R 2307/025* (2013.01)

(58) Field of Classification Search
CPC .......... H04R 19/005; H04R 1/08; H04R 9/08; H04R 11/14; H04R 17/02; H04R 21/02
USPC ........................................ 381/355–360, 369
See application file for complete search history.

(56) References Cited

U.S. PATENT DOCUMENTS

| | | | | |
|---|---|---|---|---|
| 8,295,515 | B2* | 10/2012 | Kuratani | H04R 19/005 381/175 |
| 8,617,934 | B1* | 12/2013 | Minervini | B81C 1/00333 29/609.1 |
| 10,329,143 | B2* | 6/2019 | Formosa | H04R 19/04 |
| 2019/0023561 | A1* | 1/2019 | Chan | B81B 7/0035 |

* cited by examiner

*Primary Examiner* — Suhan Ni
(74) *Attorney, Agent, or Firm* — Loppnow & Chapa; Matthew C. Loppnow

(57) ABSTRACT

A microphone assembly comprises a substrate. An acoustic transducer is disposed on the substrate and configured to generate an electrical signal responsive to an acoustic signal. An integrated circuit is disposed on the substrate and electrically coupled to the acoustic transducer. An enclosure is disposed on the substrate, and comprises a main body, and a sidewall projecting axially from outer edges of the main body towards the substrate and contacting the substrate such that an internal volume is defined between the enclosure and the substrate. An insulating layer is insert molded on an inner surface of the enclosure, or over molded on an outer surface of the enclosure such that the insulating layer is not disposed on a portion of the sidewall proximate to the substrate.

10 Claims, 6 Drawing Sheets

INSERT MOLDED OR OVER MOLDED INSULATING LAYERS ON ENCLOSURES FOR MICROPHONE ASSEMBLIES

TECHNICAL FIELD

The present disclosure relates generally to systems and methods for providing an insulating layer on an enclosure of a microphone assembly.

BACKGROUND

Microphone assemblies are generally used in electronic devices to convert acoustic energy to electrical signals. Advancements in micro and nanofabrication technologies have led to the development of progressively smaller micro-electro-mechanical-system (MEMS) microphone assemblies. The small size of MEMS microphone assemblies can make them prone to noise issues. Particularly, temperature changes in the internal volume defined by the enclosure due to thermal conduction through the enclosure can contribute to noise.

SUMMARY

In some embodiments, a microphone assembly comprises a substrate. An acoustic transducer is disposed on the substrate, the acoustic transducer configured to generate an electrical signal responsive to an acoustic signal. An integrated circuit is disposed on the substrate and is electrically coupled to the acoustic transducer. An enclosure is disposed on the substrate, the enclosure comprising a main body, and a sidewall projecting axially from outer edges of the main body towards the substrate and contacting the substrate such that an internal volume is defined between the enclosure and the substrate. An insulating layer is insert molded on an inner surface of the enclosure such that the insulating layer is not disposed on a portion of the sidewall proximate to the substrate.

In some embodiments, an enclosure for a microphone assembly with an insulating layer is formed by the process of: disposing the enclosure in a mold cavity of a mold, the enclosure comprising a main body and a sidewall projecting axially from outer edges of the main body; inserting an insulating material into the mold cavity through an inlet of the mold; and solidifying the insulating material such that an insulating layer of the insulating material is insert molded on an inner surface of the enclosure.

In some embodiments, a microphone assembly comprises a substrate and an acoustic transducer disposed on the substrate. The acoustic transducer is configured to generate an electrical signal responsive to an acoustic signal. An integrated circuit is disposed on the substrate and electrically coupled to the acoustic transducer. An enclosure is disposed on the substrate. The enclosure comprises a main body, and a sidewall projecting axially from outer edges of the main body towards the substrate and contacting the substrate such that an internal volume is defined between the enclosure and the substrate. An insulating layer is over molded on an outer surface of the enclosure such that the insulating layer is not disposed on a portion of the sidewall proximate to the substrate.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

Figure 1:
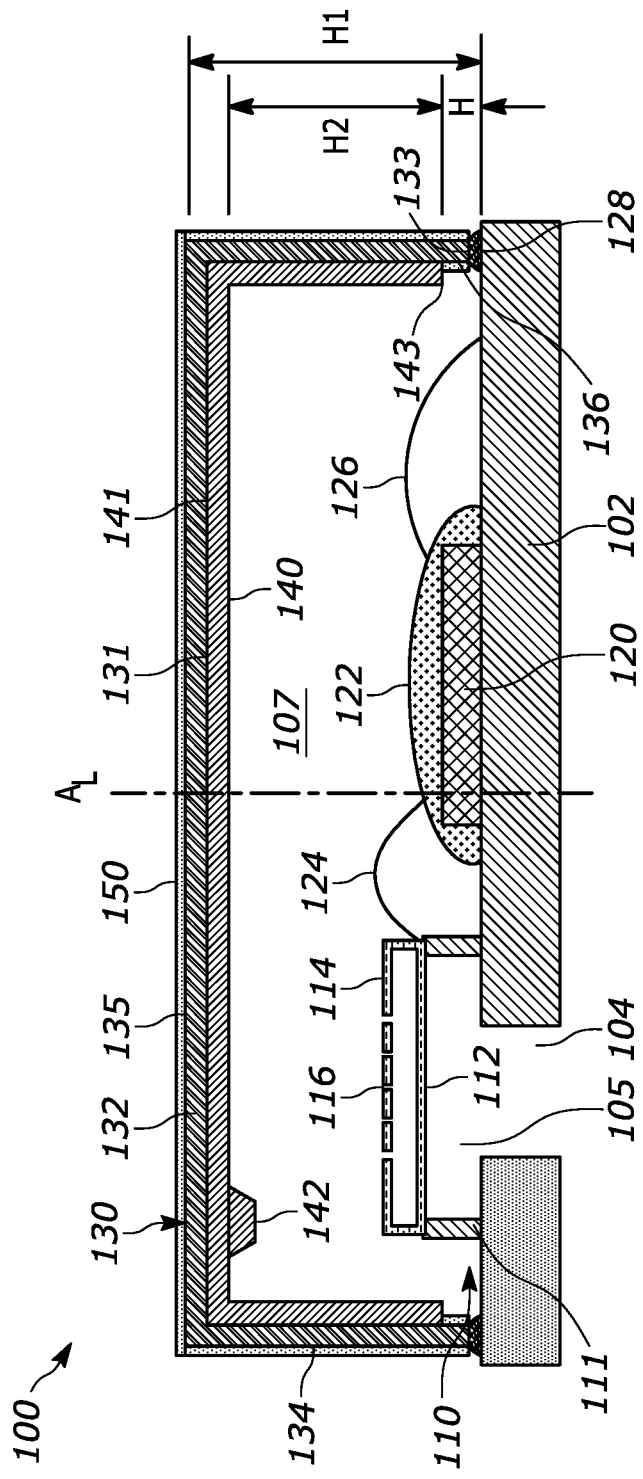
FIG. 1 is a side cross-section view of a microphone assembly including an enclosure having an insert molded insulating layer, according to an embodiment.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION

Embodiments described herein relate generally to enclosures for microphone assemblies including an insulating layer insert molded or over molded on the enclosure, the insulating layer reducing heat transfer into the internal volume of the enclosure.

Small MEMS microphone assemblies have allowed incorporation of such microphone assemblies in compact devices such as cell phones, laptops, wearables, TV/set-top box remotes, etc. The MEMS microphone industry faces continuous demand to reduce footprint, package volume, power consumption and cost while increasing performance and reliability. Generally, the can or enclosure which houses the components of the microphone assembly is filled with air. Miniaturization of MEMS microphone assemblies has allowed enclosures of the MEMS microphone assemblies to have very small internal volumes, for example, in a range of 1-5 mm$^3$. The enclosure provides an electromagnetic shield as well as a protective cover for the components of the microphone assembly.

However, such MEMS microphone assemblies pose other unique challenges, particularly because of their small dimensions. For example, the enclosure may not provide sufficient electromagnetic compatibility (EMC) with RF signals that the microphone assembly may be subjected to. The RF signals, which may be produced by other components of a system in which the microphone assembly is disposed, may impinge on, and be absorbed in the enclosure causing an increase in the temperature of the enclosure. This heat is conducted into the internal volume defined by the enclosure causing an increase in the air disposed in the internal volume which contributes to acoustic noise (e.g., due to change in density and hence partial pressure of the air present in the internal volume). In other instances, the enclosure may be subject to radiant heat, for example, produced by other components of a system that includes the microphone assembly, which can also result in heating of the enclosure.

In contrast, embodiments of the diaphragm assemblies and acoustic transducers described herein may provide one or more benefits including, for example: (1) providing an insulation layer on an inner surface or outer surface of an enclosure of a microphone assembly, thereby reducing heat conductance and reducing noise; (2) over molding or insert molding the insulating layer on the enclosure, thereby allowing bulk fabrication of the enclosures with insulating layers in a facile, rapid and cost effective manner; (3) providing an insulating layer that is in continuous contact with the enclosure, thereby providing better insulation; and (4) allowing control over height of the insulating layer so that a portion of sidewalls of the enclosure that are bonded to a substrate of the microphone assembly is left uncovered so as to prevent the insulating layer from interfering in the bonding of the enclosure to the substrate.

FIG. 1 is a side cross-section view of a microphone assembly 100, according to a particular embodiment. The microphone assembly 100 may be used for converting acoustic signals into electrical signals in any device such as, for example, cell phones, laptops, TV/set top box remotes, tablets, audio systems, head phones, wearables, portable speakers, car sound systems or any other device which uses a microphone assembly.

The microphone assembly 100 comprises a substrate 102, an acoustic transducer 110, an integrated circuit 120 and an enclosure or cover 130. The substrate 102 can be formed from materials used in printed circuit board (PCB) fabrication (e.g., plastics). For example, the substrate 102 may include a PCB configured to mount the acoustic transducer 110, the integrated circuit 120 and the enclosure 130 thereon. A sound port 104 is formed through the substrate 102. The acoustic transducer 110 is positioned on the sound port 104, and is configured to generate an electrical signal responsive to an acoustic signal received through the sound port 104.

In FIG. 1, the acoustic transducer 110 and the integrated circuit 120 are shown disposed on a surface of the substrate 102, but in other embodiments one or more of these components may be disposed on the enclosure 130 (e.g., on an inner surface of the enclosure 130) or sidewalls of the enclosure 130 or stacked atop one another. In some embodiments, the substrate 102 includes an external-device interface having a plurality of contacts coupled to the integrated circuit 120, for example, to connection pads (e.g., bonding pads) which may be provided on the integrated circuit 120. The contacts may be embodied as pins, pads, bumps or balls among other known or future mounting structures. The functions and number of contacts on the external-device interface depend on the protocol or protocols implemented and may include power, ground, data, and clock contacts among others. The external-device interface permits integration of the microphone assembly 100 with a host device using reflow-soldering, fusion bonding, or other assembly processes.

In various embodiments, the acoustic transducer 110 may comprise a diaphragm 112, and a back plate 114 disposed above the diaphragm 112. The diaphragm 112 and the back plate 114 may be disposed on a transducer substrate 111. The diaphragm 112 may have a thickness in a range of 1-10 microns. As shown in FIG. 1, the diaphragm 112 separates a front volume 105 defined between the diaphragm 112 and the sound port 104, from the internal volume 107 that forms a back volume the microphone assembly 100 between the enclosure 130 and diaphragm 112. Thus, the microphone assembly 100 is a bottom port microphone assembly in which the sound port 104 is defined in the substrate 102 such that an internal volume 107 of the enclosure 130 defines the back volume. It should be appreciated that in other embodiments, the concepts described herein may be implemented in a top port microphone assembly in which a sound port is defined in the enclosure 130 of the microphone assembly 100.

In some implementations, the acoustic transducer 110 may include a MEMS transducer embodied as a condenser-type transducer having the diaphragm 112 (e.g., a diaphragm) movable relative to the back plate 114 in response to changes in acoustic pressure. Alternatively, the MEMS acoustic transducer 110 may include a piezoelectric device, or some other known or future electro-acoustic transduction device implemented using MEMS technology. In still other implementations, the acoustic transducer 110 is a non-MEMS device embodied, for example, as an electret or other known or future non-MEMS type transduction device.

In some embodiments, the acoustic transducer 110 may be formed from a dielectric and/or conductive material (e.g., silicon oxide, silicon nitride, silicon carbide, gold, aluminum, platinum, etc.). Movement of the diaphragm 112 in response to the acoustic signal may generate an electrical signal (e.g., a voltage corresponding to a change in capacitance thereof), which may be measured and is representative of the acoustic signal. In some implementations, vibration of the membrane relative to the back plate 114 (e.g., a fixed back plate) causes changes in the capacitance between the diaphragm 112 and the back plate 114 and corresponding changes in the generated electrical signal. In other embodiments, the acoustic transducer 110 may be formed from a piezoelectric material, for example, quartz, lead titanate, III-V and II-VI semi-conductors (e.g., gallium nitride, indium nitride, aluminum nitride, zinc oxide, etc.), graphene, ultra nanocrystalline diamond, polymers (e.g., polyvinylidene fluoride) or any other suitable piezoelectric material. In such embodiments, vibration of the acoustic transducer 110 in response to the acoustic signal may generate an electrical signal (e.g., a piezoelectric current or voltage) which is representative of the acoustic signal. In some embodiments, a pierce or throughhole is defined through the diaphragm 112 to provide pressure equalization between the front and back volumes 105 and 107. In other embodiments, a vent may be defined in the enclosure 130 to allow pressure equalization.

The back plate 114 is disposed above the diaphragm 112 such that the back plate 114 is spaced apart from the diaphragm 112. A plurality of apertures 116 are defined in the back plate 114. The back plate 114 may be formed from polysilicon, silicon nitride, other suitable materials (e.g., silicon oxide, silicon, ceramics, etc.), or sandwiches thereof. Vibrations of the diaphragm 112 relative to the back plate 114 which is substantially fixed (e.g., substantially inflexible relative to the diaphragm 112) in response to acoustic signals received on the diaphragm 112 causes changes in the capacitance between the diaphragm 112 and the back plate 114, and corresponding changes in the generated electrical signal. While the back plate 114 is disposed above the diaphragm 112 as shown in FIG. 1, in other embodiments the back plate 114 may be disposed below the diaphragm 112, or the back plate 114 may be disposed between a first and second diaphragm each of which includes the diaphragm 112 in a dual diaphragm acoustic transducer, or any other acoustic transducer.

The integrated circuit 120 is positioned on the substrate 102. The integrated circuit 120 is electrically coupled to the acoustic transducer 110, for example, via a first electrical lead 124 and also to the substrate 102 (e.g., to a trace or other electrical contact disposed on the substrate 102) via a second electrical lead 126. The integrated circuit 120 receives an electrical signal from the acoustic transducer 110 and may amplify and condition the signal before outputting a digital or analog electrical signal as is known generally. The integrated circuit 120 may also include a protocol interface (not shown), depending on the output protocol desired. The integrated circuit 120 may also be configured to permit programming or interrogation thereof as described herein. Exemplary protocols include but are not limited to PDM, PCM, SoundWire, I2C, I2S and SPI, among others.

The integrated circuit 120 may include one or more components, for example, a processor, a memory, and/or a communication interface. The processor may be implemented as one or more general-purpose processors, an application specific integrated circuit (ASIC), one or more field programmable gate arrays (FPGAs), a digital signal processor (DSP), a group of processing components, or other suitable electronic processing components. In other embodiments, the DSP may be separate from the integrated circuit 120 and in some implementations, may be stacked on the integrated circuit 120. In some embodiments, the one or more processors may be shared by multiple circuits and, may execute instructions stored, or otherwise accessed, via different areas of memory). Alternatively, or additionally, the one or more processors may be structured to perform or otherwise execute certain operations independent of one or more co-processors. In other example embodiments, two or more processors may be coupled via a bus to enable independent, parallel, pipelined, or multi-threaded instruction execution. All such variations are intended to fall within the scope of the present disclosure. For example, a circuit as described herein may include one or more transistors, logic gates (e.g., NAND, AND, NOR, OR, XOR, NOT, XNOR, etc.), resistors, multiplexers, registers, capacitors, inductors, diodes, wiring, and so on.

A protective coating 122 may be disposed on the integrated circuit 120, in some implementations. The protective coating 122 may include, for example a silicone gel, a laminate, or any other protective coating configured to protect the integrated circuit 120 from moisture and/or temperature changes.

Figure 2A:
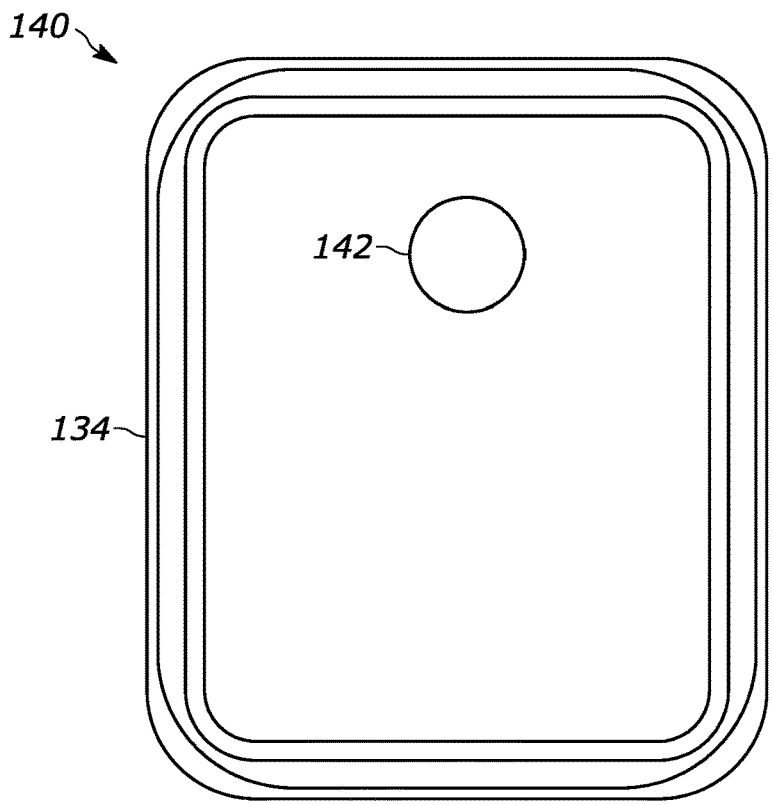
FIG. 2A is a bottom plan view.
Figure 2B:
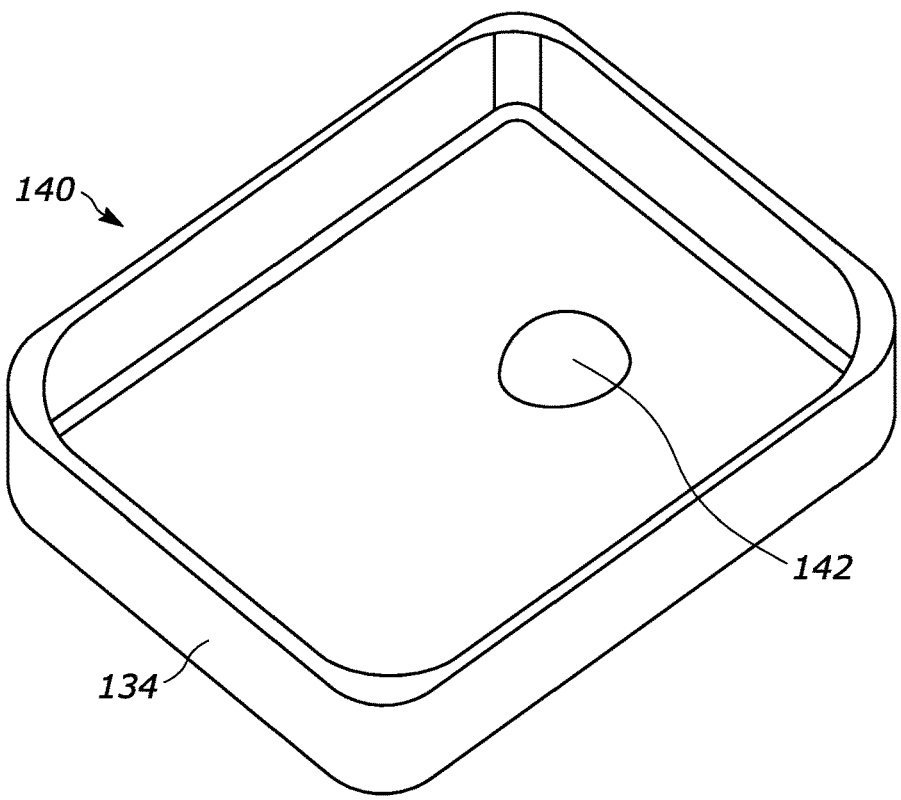
FIG. 2B is a bottom perspective view of the enclosure of FIG. 1, according to an embodiment.

Referring also now to FIGS. 2A-2B, the enclosure 130 is positioned on the substrate 102. The enclosure 130 defines the internal volume 107 within which at least the integrated circuit 120 and the acoustic transducer 110 is positioned. For example, as shown in FIG. 1, the enclosure 130 is positioned on the substrate 102 and the substrate 102 and the enclosure 130 cooperatively define the internal volume 107. As previously described herein, the internal volume 107 defines the back volume of the microphone assembly 100. The enclosure 130 may be formed from a suitable material such as, for example, metals (e.g., aluminum, copper, stainless steel, brass, etc.), and is coupled to the substrate 102 at a bond 128. The bond 128 may include, for example, an adhesive, a solder or a fusion bond. The enclosure 130 comprises a main body 132 and a sidewall 134 projecting axially from outer edges of the main body 132 towards the substrate 102 and contacting the substrate 102, where an end 133 of the sidewall 134 contacting the substrate 102 is coupled thereto by the bond 128.

In some instances, the microphone assembly 100 may be exposed to RF signals, for example, generated by other components of a system including the microphone assembly 100. The RF signals may absorb in the enclosure 130 and cause heating of the enclosure 130. The heat is conducted into the internal volume 107 (i.e., the back volume) and heats the air contained therein, which contributes to acoustic noise.

To decrease thermal conduction from the enclosure 130 into the internal volume 107, an insulating layer 140 is insert molded on an inner surface 131 of the enclosure 130 such that the insulating layer 140 is not disposed on a portion 136 of the sidewall 134 proximate to the substrate 102. Particularly, the insulating layer is not disposed on a portion of the sidewall 134 that is located between the end 133 of the sidewall 134 in contact with the substrate 102, and an outer end 143 of the insulating layer 140 located proximate to the substrate 102. For example, as shown in FIG. 1, the sidewall 134 has a height H1 and a portion of the insulating layer 140 disposed on the sidewall 134 has height H2 selected such that the portion 136 of the sidewall 134 does not have the insulating layer 140 disposed thereon. In some embodiments, the height H of the portion 136 is less than three-quarter (¾) times the height H1 of the sidewall 134. For example, the portion 136 may have a height equal to or less than 100 microns.

Some conventional enclosures for use with microphone assemblies may have a preformed insert coupled to an inner surface of an enclosure via an adhesive. The drawbacks' of such an approach include that on portions of the inner surface of such enclosures where the adhesive is not present, a gap remains between the preformed insulating layer and the corresponding surface of the enclosure, which may lead to thermal leakage into the inner volume of the enclosure, and therefore provided inferior thermal insulation. Furthermore, since enclosures for microphone assemblies have small dimensions (e.g., 1-5 mm$^3$), accurate positioning of such preformed inserts into the enclosure is tedious and prone to errors. Complicated jigs and fixtures may be needed which significantly increases manufacturing complexity and cost.

In contrast, a surface 141 of the insulating layer 140 is in continuous contact with the corresponding inner surface 131 of the enclosure 130, a benefit provided by insert molding the insulating layer directly onto the inner surface 131 of the enclosure 130. Thus, the insulating layer 140 is directly formed on the inner surface 131 of the enclosure 130 in one molding step and the insulating material that forms the insulating layer 140 adheres to the inner surface 131 of the enclosure 130 as it solidifies during the molding process.

In this manner, the complicated steps of alignment, positioning and adhering that are used with preformed inserts are eliminated, thereby reducing manufacturing complexity and cost. Furthermore, continuous contact of the insulating layer 140 with the inner surface of the enclosure 130 provides superior thermal insulation. In addition, the molding process enables leaving the portion 136 of the sidewall exposed, without having to perform additional etching or material removal process. This facilitates bonding of the end 133 of the sidewall 134 of the enclosure 130 to the substrate 102 via the bond 128 without the insulating layer 140 interfering with the bonding process.

Furthermore, the insulating layer 140 may serve as a barrier for a soldering material, that may be used to form the bond 128 to couple the enclosure 130 to the substrate 102, from flowing upwards along the sidewall 134 of the enclosure 130. For example, in conventional enclosures that do not include the insulating layer insert molded therein, solder material that is present on the substrate 102 and serves as a bonding pad for the enclosure 130 is heated to a temperature in a range of 220 degrees Celsius to 270 degrees Celsius. This melts the solder material that forms the bond 128 with the enclosure 130 on cooling to its solidification temperature. In some instances, the melted solder material can flow up the sidewall 134 along the inner surface 131 of the enclosure 130. The melted solder material can flow to the roof of the enclosure 130 and then fall as small solder particles on the acoustic transducer 110, the integrated circuit 120 and other components of the microphone assembly 100 disposed within the enclosure 130, which can damage these components. In contrast, the insert molded insulating layer 140 serves as a physical barrier that limits flow of the solder material to the portion 136 thereby, preventing the solder material from flowing to the roof of the enclosure 130 and falling on the components of the microphone assembly 100.

The insulating layer 140 may be formed from any suitable material, for example, a liquid crystal polymer, a mold compound, or an engineering plastic. In particular embodiments, the insulating layer is formed from a liquid crystal polymer. The liquid crystal polymer may have a melting temperature in a range of 250 to 400 degrees Celsius. In some embodiments, the liquid crystal polymer includes as aromatic polyesters such as those provided under the trade name VECTRA®. In particular embodiments, the liquid crystal polymer comprises a high melting temperature VECTRA® LCP, having a melting temperature of approximately 335 degrees Celsius. In various embodiments, the liquid crystal polymer may be reinforced with glass. In other embodiments, the liquid crystal polymer includes KEVLAR®.

In still other embodiments, the insulating layer 140 may be formed from a mold compound, for example, an engineered mold epoxy (e.g., an epoxy cresol novolak cured with a phenolic novolak, etc.). In still other embodiments, the insulating polymer is an engineered plastic, for example, low density polyethylene, polypropylene, polystyrene, acrylonitrile butadiene styrene, acetal, etc.

In some embodiments, the insulating layer 140 has a thickness in a range of 50-100 microns. For example, the insulating layer 140 may have a thickness in a range of 55 microns to 90 microns, 60 microns to 80 microns, 70 microns to 100 microns, or any other suitable thickness. In particular embodiments, the insulating layer 140 has a thickness of approximately 70 microns.

In some embodiments, the insulating layer 140 further comprises a mold gate 142 protruding from a surface of the insulating layer 140 disposed on the main body 132 of the enclosure 130, and protruding away from the main body 132. The mold gate 142 corresponds to a portion of the insulating material disposed in a gate or opening of mold through which the insulating material is poured into a mold cavity of the mold. The enclosure 130 is positioned in the mold cavity and the insulating material (e.g., liquid crystal polymer, or any other melted or liquefied insulating material) is inserted into the mold cavity via the gate. The portion of the insulating material remaining in the gate solidifies to form the mold gate 142 and may be left protruding from the insulating layer 140 once the enclosure 130 with the insulating layer 140 insert molded thereon is removed from the mold.

As shown in FIGS. 1 and 2A-2B, the mold gate 142 is radially offset from a longitudinal axis $A_L$ of the microphone assembly 100. For example, the inlet or gate of the mold used for insert molding the insulating layer 140 on the inner surface 131 of the enclosure 130 may be offset from a longitudinal axis (i.e., a center) of the enclosure 130 such that once the insulating layer 140 has been molded, the mold gate 142 is offset from the longitudinal axis $A_L$ for example, located proximate to a side or corner of the enclosure 130. This may prevent the mold gate 142 from interfering with (i.e., contacting) components of the microphone assembly 100 (e.g., the acoustic transducer 110 or the integrated circuit 120) positioned within the internal volume of the enclosure 130, and/or provide space for forming markings (e.g., stamping or laser etching a product number, serial number, batch number, etc.) on an inner surface of the insulating layer 140, that are generally formed proximate to a center of enclosure 130.

In some embodiments, a shielding layer 150 of a shielding material is also disposed on at least the outer surface 135 of the enclosure 130. In some embodiments, the shielding layer 150 may also be disposed on the portion 136 of the sidewall 134 of the enclosure 130, or any other exposed portion of the enclosure 130 on which the insulating layer 140 is not disposed, for example, in implementations in which the shielding layer 150 is disposed on the enclosure 150 after the insulating layer 140 has been insert molded thereon. In other embodiments, the shielding layer 150 may be disposed on the enclosure 130 before the insulating layer 140 is insert molded thereon. In such embodiments, the shielding layer 150 is disposed on each of the inner surface 131 and the outer surface 135 of the enclosure 130, and is interposed between the insulating layer 140 and the enclosure 130.

The shielding material forming the shielding layer 150 may include copper, nickel, tin, chrome, gold, silver, or any other suitable material. The shielding layer is configured to provide additional electromagnetic shielding, for example, to improve signal-to-noise ratio. The shielding layer 150 may be disposed on the enclosure 130 using electroplating, electro-less plating, vacuum deposition, or any other suitable deposition process.

Figure 3:
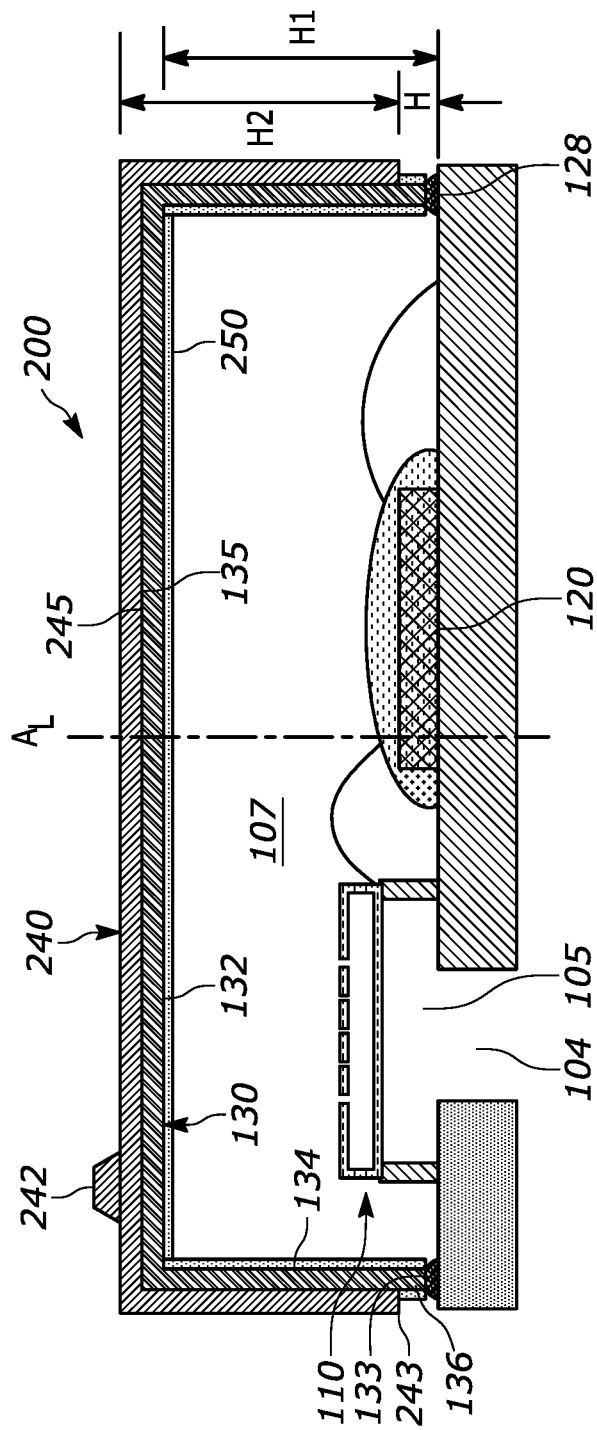
FIG. 3 is a side cross-section view of a microphone assembly including an enclosure having an over molded insulating layer, according to another embodiment.

FIG. 3 is a side cross-section view of a microphone assembly 200, according to another embodiment. The microphone assembly 200 may be used for converting acoustic signals into electrical signals in any device such as, for example, cell phones, laptops, TV/set top box remotes, tablets, audio systems, head phones, wearables, portable speakers, car sound systems or any other device which uses a microphone assembly.

The microphone assembly 200 comprises the substrate 102 defining the sound port 104 therein, the acoustic transducer 210, the integrated circuit 120, the enclosure or cover 130 and generally includes the same components as described in detail with respect to the microphone assembly 200 FIG. 1. In FIG. 3, the acoustic transducer 110 and the integrated circuit 120 are shown disposed on a surface of the substrate 102, but in other embodiments one or more of these components may be disposed on the enclosure 130 (e.g., on an inner surface of the enclosure 130) or sidewalls of the enclosure 130 or stacked atop one another. Furthermore, while FIG. 3 shows a bottom port microphone assembly 200, in other embodiments, the concepts described herein may be implemented in a top port microphone assembly in which a sound port is defined in the enclosure 130 of the microphone assembly 200.

As shown in FIG. 3, the enclosure 130 defines the internal volume 107 within which at least the integrated circuit 120 and the acoustic transducer 110 is positioned. The internal volume 107 forms the back volume of the microphone assembly 200. The enclosure 130 comprises the main body 132 and the sidewall 134 projecting axially from outer edges of the main body 132 towards the substrate 102 and contacting the substrate 102, where an end 133 of the sidewall 134 contacting the substrate 102 is coupled thereto by the bond 128.

Different from the microphone assembly 100, the microphone assembly 200 includes an insulating layer 240 over molded on an outer surface 135 of the enclosure 130 such that the insulating layer 240 is disposed outside the internal volume 107 defined by the enclosure 130. The insulating layer 240 is not disposed on a portion 136 of the sidewall 134 of the enclosure 130 proximate to the substrate 102, that is located between the end 133 of the sidewall 134 in contact with the substrate 102, and an outer end 243 of the insulating layer 240 proximate to the substrate 102. For example, as shown in FIG. 3, the sidewall 134 has a height H1 and a portion of the insulating layer 240 disposed on the sidewall 134 has height H2, such that the portion 136 of the sidewall 134 does not have the insulating layer 240 disposed thereon. In some embodiments, the height H of the portion 136 is less than ¾ times the height H1 of the sidewall 134. For example, the portion 136 that does not include the insulating layer 240 may have a height equal to or less than 100 microns.

A surface 245 of the insulating layer 140 continuously contacts with the corresponding outer surface 135 of the enclosure 130. Thus, the insulating layer 240 is directly formed on the outer surface 135 of the enclosure 130 in one molding step and the insulating material that forms the insulating layer 240 adheres to the outer surface 135 of the enclosure 130 as it solidifies during the molding process.

The insulating layer 240 may be formed from any suitable material as described in detail with respect to the insulating layer 140. In some embodiments, the insulating layer 240 has a thickness in a range of 50 microns to 100 microns. For example, the insulating layer 240 may have a thickness in a range of 55 microns to 90 microns, 60 microns to 80 microns, 70 microns to 100 microns, or any other suitable thickness. In particular embodiments, the insulating layer 240 has a thickness of approximately 70 microns.

In some embodiments, the insulating layer 240 further comprises a mold gate 242 protruding from a surface of the insulating layer 240 disposed on the main body 132 of the enclosure 130, and protruding away from the main body 132. The mold gate 242 is radially offset from a longitudinal axis $A_L$ of the microphone assembly 100. This may provide space for forming markings (e.g., laser etching a product number, serial number, batch number, etc.) on an outer surface of the insulating layer 240 proximate to a center of enclosure 130.

Furthermore, as described with respect to the microphone assembly 100, a shielding layer 250 is also disposed on at least the inner surface 131 of the enclosure 130 that is opposite the outer surface 135. In some embodiments, the shielding layer 250 may also be disposed on the portion 136 of the sidewall 134. The shielding layer 250 is substantially similar to the shielding layer 150 and therefore, not described in further detail herein.

Figure 4A:
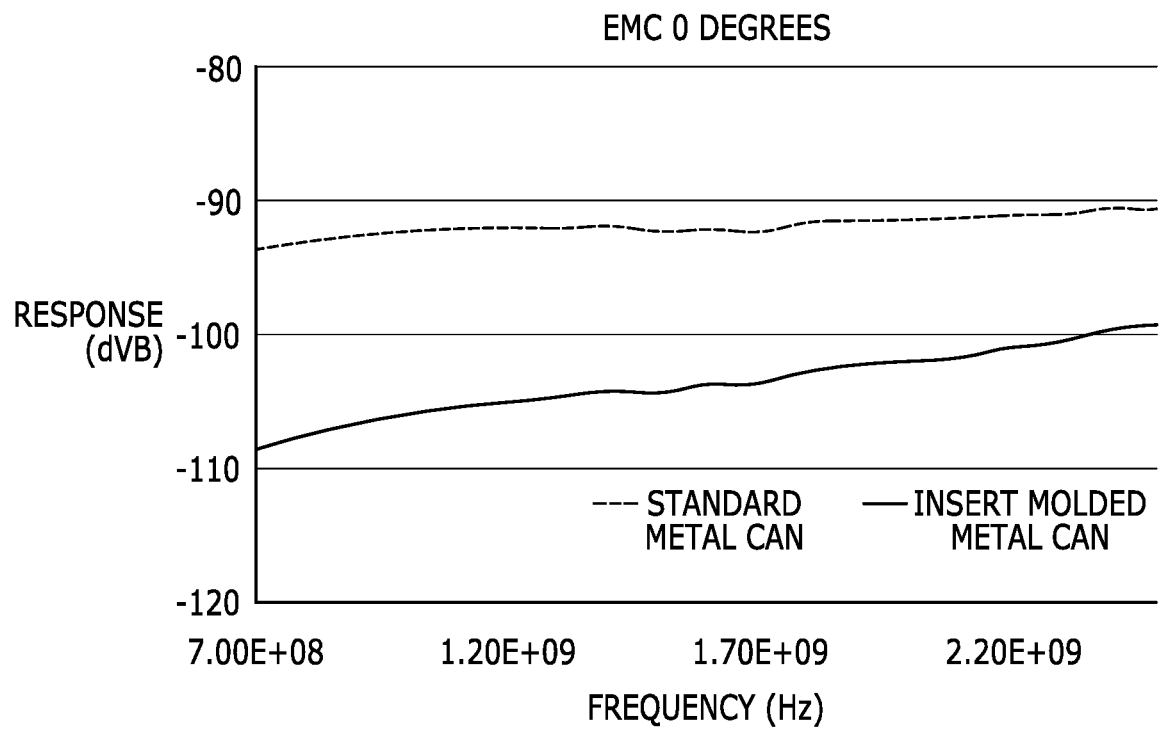
FIGS. 4A and 4B show plots of electromagnetic interference (EMI) detected through an enclosure due to radiated radio frequency (RF) waves, and improvement in the EMI by an insert molding insulating layer disposed on inner surface of the enclosure.
Figure 4B:
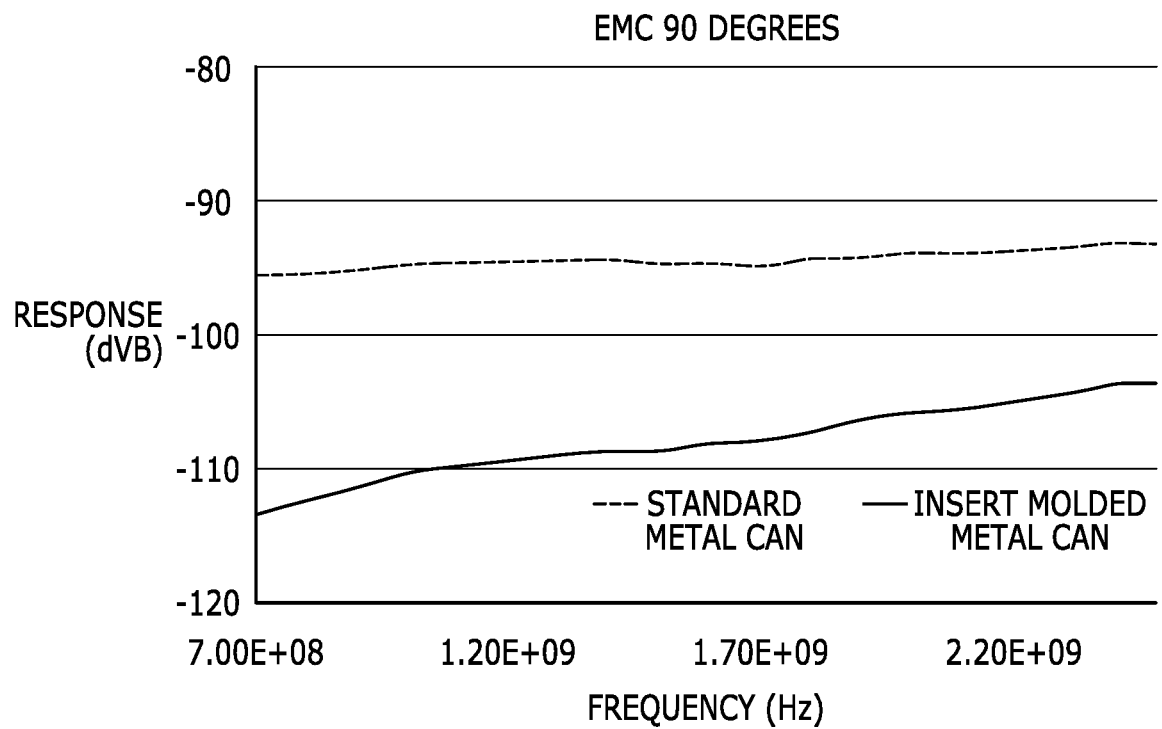

FIGS. 4A and 4B are plots of EMC showing electromagnetic interference (EMI) detected through an enclosure of a microphone assembly due to radiated radiofrequency (RF) waves, and improvement in the EMI provided by an insert molded insulating layer disposed on inner surface of the enclosure. The insulating layer includes a liquid crystal polymer having a thickness in a range of about 70-100 microns. In FIG. 4A the RF source was positioned at an angle of zero degrees with respect to the enclosure of the enclosure, and in FIG. 4B the RF source was positioned at an angle of 90 degrees with respect to the enclosure. The RF source was scanned over a frequency range from 0.7 GHz to 2.2 GHz. A 10-15 dB improvement in EMC (i.e., 10-15 dB improvement in EMI) was observed when the insulating layer is insert molded on an inner surface of the enclosure.

Figure 5:
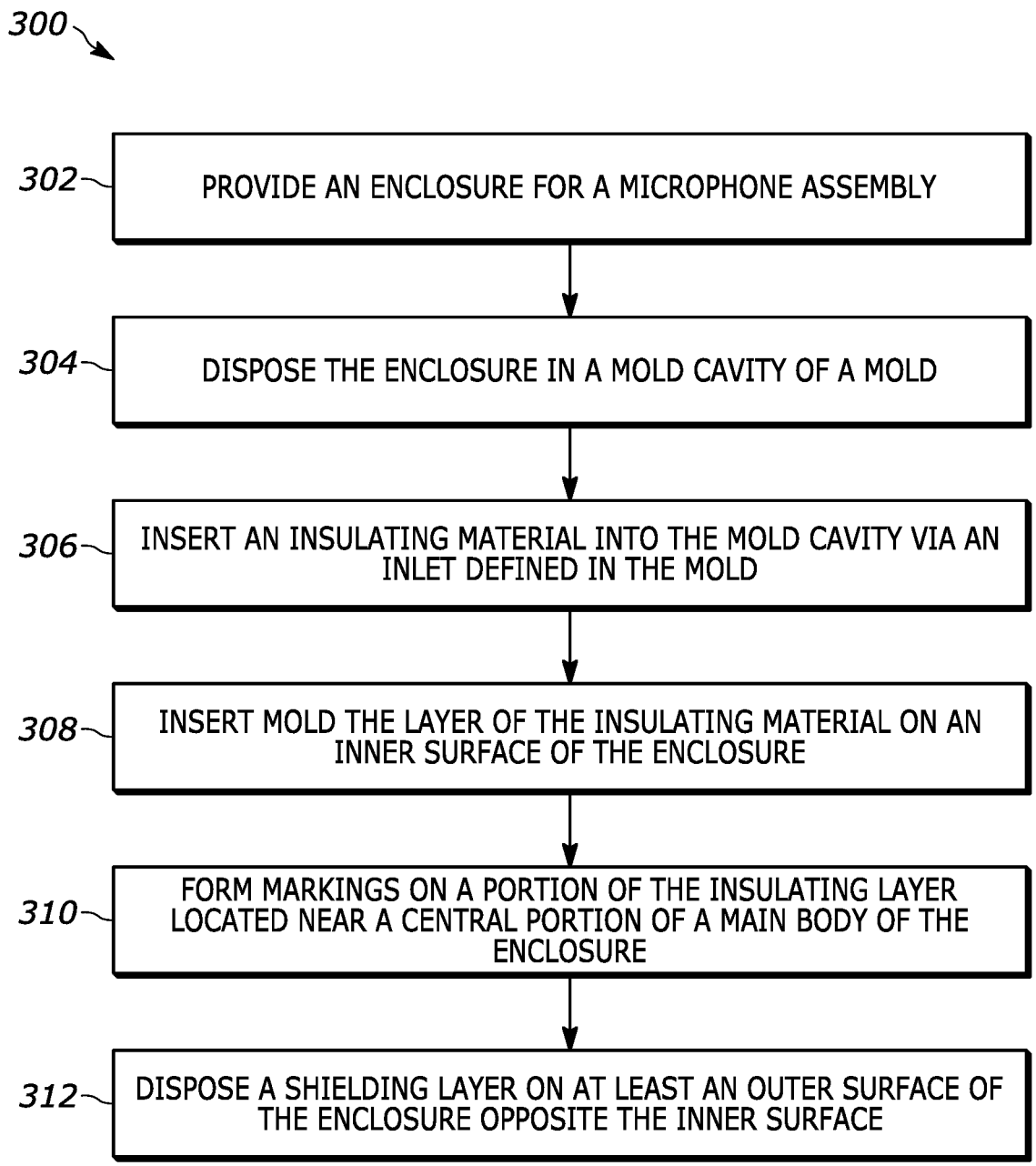
FIG. 5 is a schematic flow diagram of a method for insert molding an insulating layer on an inner surface of an enclosure of a microphone assembly, according to an embodiment.

FIG. 5 is a schematic flow diagram of method 300 for insert molding an insulating layer on an inner surface of an enclosure (e.g., the enclosure 130) of a microphone assembly (e.g., the microphone assembly 100). The method 300 includes providing an enclosure, at 302. For example, the enclosure 130 that includes a main body 132 and a sidewall 134 projecting axially from outer edges of the main body 132 is provided.

At 304, the enclosure is disposed in a mold cavity of a mold. The mold cavity may be structured to allow insert molding of an insulating layer on an inner surface (e.g., the inner surface 131) of the enclosure (e.g., the enclosure 130).

At 306, an insulating material is inserted into the mold cavity through an inlet or gate of the mold. At 308, the insulating material is solidified such that an insulating layer (e.g., the insulating layer 140) of the insulating material is insert molded on an inner surface of the enclosure.

The insulating material may include a liquid crystal polymer, a mold compound, or an engineering plastic. In particular embodiments, the insulating layer is formed from a liquid crystal polymer. The liquid crystal polymer may have a melting temperature in a range of 250 to 400 degrees Celsius. In some embodiments, the liquid crystal polymer includes as aromatic polyesters such as those provided under the trade name VECTRA®. In particular embodiments, the liquid crystal polymer comprises a high melting temperature VECTRA® LCP, having a melting temperature of approximately 335 degrees Celsius. In various embodiments, the liquid crystal polymer may be reinforced with glass. In other embodiments, the liquid crystal polymer includes KEVLAR®.

In other embodiments, the insulating layer may be formed from a mold compound, for example, an engineered mold epoxy (e.g., an epoxy cresol novolak cured with a phenolic novolak, etc.). In still other embodiments, the insulating polymer is an engineered plastic, for example, low density polyethylene, polypropylene, polystyrene, acrylonitrile butadiene styrene, acetal, etc.

In some embodiments, the insulating material comprises a liquid crystal polymer inserted in liquid phase into the mold cavity at a temperature in a range of 250 degrees Celsius to 400 degrees Celsius and a pressure of up to 30 bar. In some embodiments, the liquid crystal polymer may be melted by heating to a melting temperature of the liquid crystal polymer, and then solidified by cooling to temperature lower than the melting temperature (e.g., cooling to room temperature). In some embodiments, the liquid crystal polymer may have a melting temperature in a range of 250 degrees Celsius to 400 degrees Celsius. In particular embodiments, the liquid crystal polymer has a temperature in a range of 330 degrees Celsius to 350 degrees Celsius. In other embodiments, the liquid crystal polymer may inherently be liquid and solidifies on exposure to an appropriate stimulus, for example, heat or ultraviolet light, that causes cross-linking of the liquid crystal polymer within the mold, therefore forming a solid insulating layer on the enclosure. In some embodiments, the solidification time is in a range of 4 hours to 6 hours.

In some embodiments, the insulating layer (e.g., the insulating layer 140) has a thickness in a range of 50 microns to 100 microns. For example, the insulating layer may have a thickness in a range of 55 microns to 90 microns, 60 microns to 80 microns, 70 microns to 100 microns, or any other suitable thickness. In particular embodiments, the insulating layer has a thickness of approximately 70 microns.

In some embodiments, the insulating layer further comprises a mold gate (e.g., the mold gate 142) protruding from a surface of the insulating layer disposed on the main body of the enclosure, and protruding away from the main body. The mold gate corresponds to a portion of the insulating material disposed in the inlet or gate of the mold through which the insulating material is poured into a mold cavity of the mold. The mold gate is radially offset from a longitudinal axis of the microphone assembly, as previously described herein.

In some embodiments, markings are formed on a portion of the insulating layer located near a central portion of a main body (e.g., the main body 132) of the enclosure (e.g., the enclosure 130 proximate to the longitudinal axis, at 310. The markings may be formed, for example, via laser etching, stamping or any other suitable process, as previously described herein. Having the mold gate radially offset from the longitudinal axis beneficially allows the markings to be formed near the central portion of the main body without the mold gate interfering with the formation of such markings.

At 312, a shielding layer of a shielding material is disposed on at least an outer surface of the enclosure that is opposite the inner surface. For example, the shielding layer 150 is disposed on the outer surface 135 of the enclosure 130, and may also be disposed on the portion 136 of the sidewall 134 of the enclosure 130. The shielding layer 150 may be disposed using electroplating, electro-less plating, vacuum deposition, or any other suitable deposition process. While described as being deposited after insert molding of the insulating layer 140, in other embodiments, the shielding layer 150 may be deposited on the enclosure 130 before the insert molding process (i.e., before operation 304).

In particular embodiments, disposing the shielding layer 150 may include rinsing the enclosure 130 with the insulating layer 140 disposed thereon (e.g., ultrasonic rinsing in deionized water), followed by electrolytic cleaning, and acid cleaning (e.g., in sulfuric acid). A first shielding material, for example, a first metal (e.g., nickel, zinc, etc.) may be deposited on the enclosure 130 followed by electroplating or electro-less plating of the first shielding material (e.g., Ni). A second shielding material, for example, a second metal (e.g., gold, copper, silver, platinum, etc.) may be deposited on the first metal. This is followed by one or more rinsing operation (e.g., ultrasonic rinsing in deionized water), followed by one or more drying operations (e.g., spin drying and/or oven baking). The shield plating process results in deposition of a shielding layer (e.g., the shielding layer 150) on exposed surfaces of the enclosure 130, i.e., one or more surfaces that do not have the insulating layer 140 disposed thereon.

Figure 6:
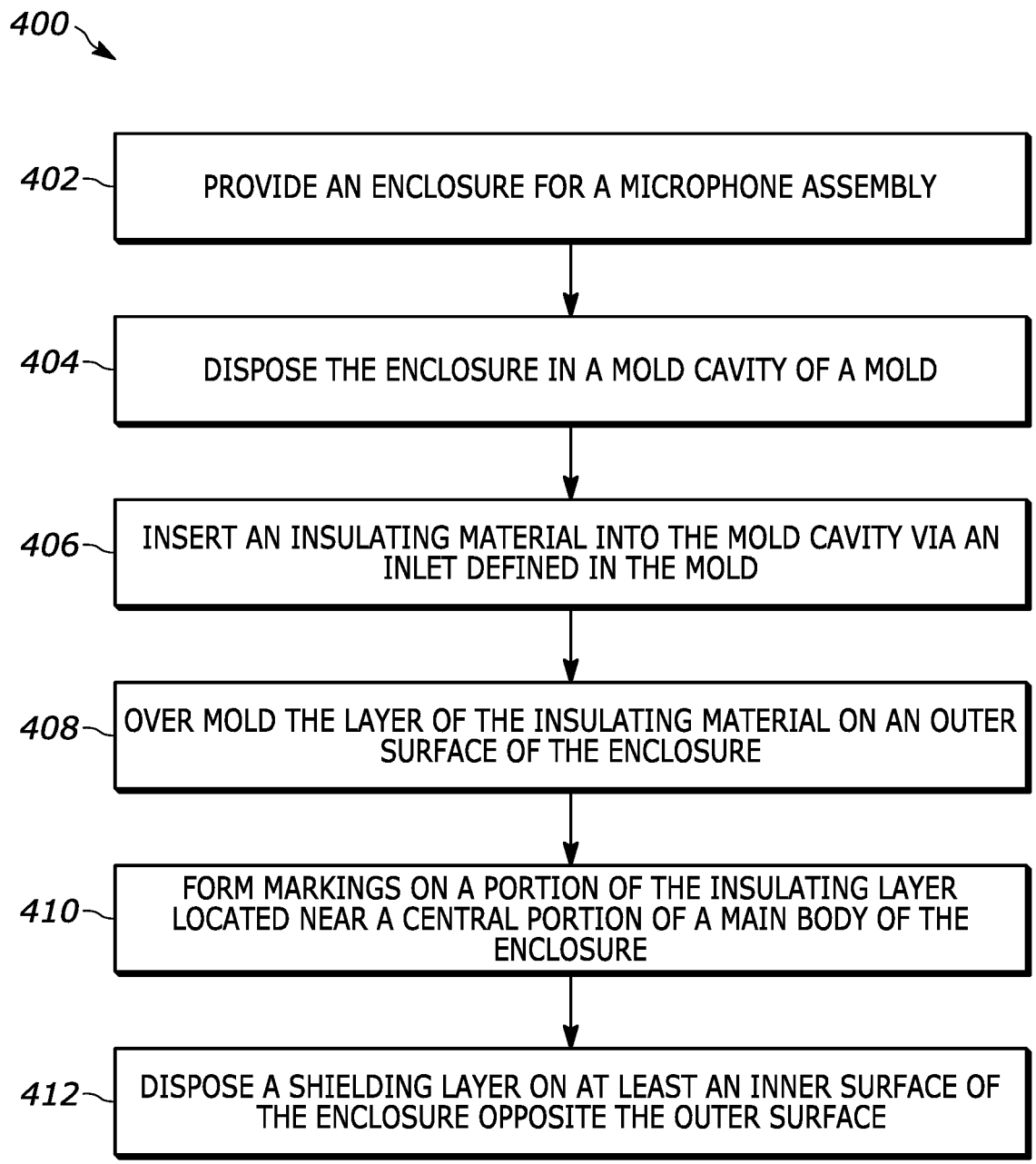
FIG. 6 is a schematic flow diagram of a method for over molding an insulating layer on an outer surface of an enclosure of a microphone assembly, according to an embodiment.

FIG. 6 is a schematic flow diagram of method 300 for over molding an insulating layer on an outer surface of an enclosure (e.g., the enclosure 130) of a microphone assembly (e.g., the microphone assembly 200). The method 300 includes providing an enclosure, at 402. For example, the enclosure 130 that includes a main body 132 and a sidewall 134 projecting axially from outer edges of the main body 132 is provided.

At 404, the enclosure is disposed in a mold cavity of a mold. The mold cavity may be structured to allow over molding the insulating layer on an outer surface (e.g., the outer surface 135) of the enclosure.

At 406, an insulating material is inserted into the mold cavity through an inlet or gate of the mold. At 408, the insulating material is solidified such that an insulating layer (e.g., the insulating layer 240) of the insulating material is over molded on an outer surface of the enclosure. The insulating material may include a liquid crystal polymer, a mold compound, an engineered plastic or any other suitable material, as previously described herein. In particular embodiments, the insulating layer may be formed from a liquid crystal polymer using similar process parameters as described with respect to method 300.

In some embodiments, the insulating layer (e.g., the insulating layer 240) has a thickness in a range of 50 microns to 100 microns. For example, the insulating layer may have a thickness in a range of 55 microns to 90 microns, 60 microns to 80 microns, 70 microns to 100 microns, or any other suitable thickness. In particular embodiments, the insulating layer has a thickness of approximately 70 microns.

In some embodiments, the insulating layer further comprises a mold gate (e.g., the mold gate 242) protruding from a surface of the insulating layer disposed on the main body of the enclosure, and protruding away from the main body. The mold gate is radially offset from a longitudinal axis of the microphone assembly, as previously described herein. In some embodiments, markings are formed on a portion of the insulating layer located near a central portion of a main body (e.g., the main body 132) of the enclosure (e.g., the enclosure 130 proximate to the longitudinal axis, at 410. The markings may be formed, for example, via laser etching, stamping or any other suitable process, as previously described herein. Having the mold gate radially offset from the longitudinal axis beneficially allows the markings to be formed near the central portion of the main body without the mold gate interfering with the formation of such markings.

At 412, a shielding layer is disposed on at least the inner surface of the enclosure. For example, the shielding layer 250 is disposed on the inner surface 131 of the enclosure 130, and may also be disposed on the portion 136 of the sidewall 134, using the same process as described with respect to the method 300. While described as being deposited after over molding of the insulating layer 140, in other embodiments, the shielding layer 250 may be deposited on the enclosure 130 before the over molding process (i.e., before operation 404).

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone assembly, comprising:
   a substrate;
   an acoustic transducer disposed on the substrate, the acoustic transducer configured to generate an electrical signal responsive to an acoustic signal;
   an integrated circuit disposed on the substrate and electrically coupled to the acoustic transducer; and
   an enclosure disposed on the substrate, the enclosure comprising:
      a main body, and
      a sidewall projecting axially from outer edges of the main body towards the substrate and contacting the substrate such that an internal volume is defined between the enclosure and the substrate; and
   an insulating layer insert molded on an inner surface of the enclosure such that the insulating layer is not disposed on a portion of the sidewall proximate to the substrate.

2. The microphone assembly of claim 1, wherein a surface of the insulating layer is in continuous contact with a corresponding surface of the enclosure.

3. The microphone assembly of claim 1, wherein a height of the portion is less than three-quarters of a height of the sidewall.

4. The microphone assembly of claim 1, wherein the insulating layer has a thickness in a range of 50-100 microns.

5. The microphone assembly of claim 1, wherein the insulating layer comprises a liquid crystal polymer.

6. The microphone assembly of claim 5, wherein the liquid crystal polymer comprises an aromatic polyester.

7. The microphone assembly of claim 1, wherein the insulating layer further comprises a mold gate protruding from a surface of the insulating layer disposed on the main body, the mold gate protruding away from the main body.

8. The microphone assembly of claim 7, wherein the mold gate is radially offset from a longitudinal axis of the microphone assembly.

9. The microphone assembly of claim 1, further comprising a shielding material disposed on at least an outer surface of the enclosure that is opposite the inner surface.

10. The microphone assembly of claim 9, wherein the shielding material is also disposed on the portion of the sidewall that is proximate to the substrate.

* * * * *